United States Patent  
Kimura et al.

(10) Patent No.: US 11,252,817 B1  
(45) Date of Patent: Feb. 15, 2022

(54) PRINTED WIRING BOARD AND MEMORY SYSTEM (71) Applicant: KIOXIA CORPORATION, Tokyo (JP)

(72) Inventors: Naoki Kimura, Kanagawa (JP); Hiroaki Komaki, Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/184,504

(22) Filed: Feb. 24, 2021

(30) Foreign Application Priority Data

Sep. 11, 2020 (JP) .............................. JP2020-153272

(51) Int. Cl.  
H05K 1/02 (2006.01)  
H05K 1/11 (2006.01)

(52) U.S. Cl.  
CPC ........... H05K 1/112 (2013.01); H05K 1/0266 (2013.01); H05K 2201/09563 (2013.01); H05K 2201/10159 (2013.01)

(58) Field of Classification Search  
CPC .......... H05K 1/0266–0269; H05K 1/112–117; H05K 2201/09563; H05K 2201/10159  
See application file for complete search history.

(56) References Cited

U.S. PATENT DOCUMENTS

| | | | |
|---|---|---|---|
| 6,609,297 B1 * | 8/2003 | Hiramatsu ........... | H05K 3/0008 174/255 |
| 8,837,161 B2 | 9/2014 | Jafari et al. | |
| 9,888,565 B2 | 2/2018 | Bang et al. | |
| 2009/0178839 A1 * | 7/2009 | Takenaka ............. | H05K 1/0269 174/266 |
| 2010/0012356 A1 * | 1/2010 | Hasegawa ............ | H05K 1/0268 174/255 |
| 2010/0208437 A1 * | 8/2010 | Maeda .................... | H01L 24/81 361/760 |
| 2011/0169164 A1 * | 7/2011 | Nakamura .......... | H05K 1/0269 257/739 |
| 2013/0168148 A1 * | 7/2013 | Kanai .................... | H05K 3/462 174/262 |
| 2013/0285079 A1 * | 10/2013 | Hayashi ............... | H05K 1/0269 257/88 |
| 2014/0083747 A1 * | 3/2014 | Matsuno ............. | H05K 1/0269 174/251 |

(Continued)

FOREIGN PATENT DOCUMENTS

JP 2002-76542 A 3/2002

Primary Examiner — Hoa C Nguyen  
(74) Attorney, Agent, or Firm — Kim & Stewart LLP (57) ABSTRACT A printed wiring board includes first, second, and third wiring layers, first and second insulating members, and first and second vias. The first wiring layer includes a recognition mark and a first wiring on a first surface. The second wiring layer includes a first pad and a second wiring. The third wiring layer includes a third wiring. The first via penetrates the first insulating member and electrically connects the recognition mark to the first pad. The second via penetrates the second insulating member and electrically connects the first pad to the third wiring. The first pad and the first and second vias are in a region within an outer perimeter of the recognition mark when viewed from a direction orthogonal to the first surface.

20 Claims, 6 Drawing Sheets

A-A SECTION

(56) References Cited

U.S. PATENT DOCUMENTS

| | | | |
|---|---|---|---|
| 2015/0257256 A1* | 9/2015 | Sato | H05K 1/0269 257/774 |
| 2016/0198564 A1* | 7/2016 | Hatazawa | H05K 3/4679 174/251 |
| 2018/0114702 A1* | 4/2018 | Kodani | H05K 1/0269 |
| 2019/0037693 A1 | 1/2019 | Kang | |
| 2019/0089044 A1* | 3/2019 | Kobuke | H01L 23/49822 |
| 2019/0327827 A1* | 10/2019 | Chang | H05K 1/181 |

* cited by examiner

A-A SECTION

PRINTED WIRING BOARD AND MEMORY SYSTEM

CROSS-REFERENCE TO RELATED APPLICATION

This application is based upon and claims the benefit of priority from Japanese Patent Application No. 2020-153272, filed Sep. 11, 2020, the entire contents of which are incorporated herein by reference.

FIELD

Embodiments described herein relate generally to a printed wiring board and a memory system.

BACKGROUND

A memory system often includes electronic components such as a non-volatile memory and a controller that controls the non-volatile memory. The electronic components are mounted on a printed wiring board, which may also be referred to as printed circuit board or the like. The printed wiring board has a surface with a wiring pattern (or a circuit pattern) formed thereon. The electronic components are mounted on the wiring pattern.

A recognition mark (or a fiducial mark) is often provided on the surface of the wiring board together with the wiring pattern. When an electronic component is mounted on the wiring pattern of the wiring board, a position of the recognition mark can be read by image recognition processing or the like. Based on the read position of the recognition mark, a mounting position of the electronic component with respect to the wiring pattern of the wiring board can be determined. The recognition mark typically occupies a large area on the surface of the wiring board in order to improve an accuracy of image recognition, but the recognition mark is generally not used after product completion. Hence, it would be desirable for the recognition mark, or the area otherwise occupied on the printed wiring board by the recognition mark, to be usable in some manner in the final device after product fabrication is completed.

DETAILED DESCRIPTION

According to one or more embodiments, a printed wiring board includes first, second, and third wiring layers, first and second insulating members, and first and second vias. The first wiring layer includes a first recognition mark and a first wiring on a first surface thereof. The first wiring surrounds the first recognition mark. The second wiring layer includes a first pad and a second wiring. The second wiring is positioned between the first recognition mark and the first wiring when viewed from the first surface of the first wiring layer. The third wiring layer includes a third wiring. The first insulating member is between the first wiring layer and the second wiring layer. The second insulating member is between the second wiring layer and the third wiring layer. The first via penetrates the first insulating member and electrically connects the first recognition mark to the first pad. The second via penetrates the second insulating member and electrically connects the first pad to the third wiring. The first pad and the first and second vias are in a region within an outermost shape of the first recognition mark when viewed from a direction orthogonal to the first surface of the first wiring layer.

Hereinafter, certain example embodiments of a printed wiring board and a memory system will be described with reference to the accompanying drawings.

Figure 1:
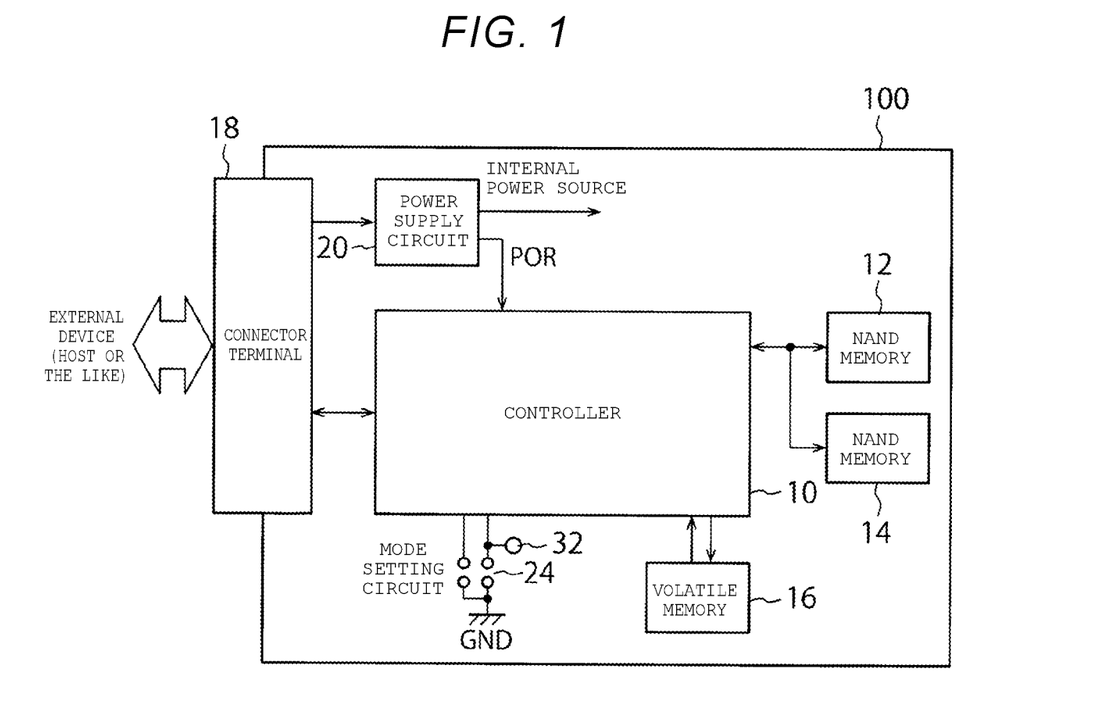
FIG. 1 is a block diagram of a circuit configuration of a memory system according to an embodiment.

An example circuit configuration of a memory system 100 according to an embodiment is shown in FIG. 1. The memory system 100 includes a controller 10, non-volatile memories 12 and 14, a volatile memory 16, connector terminals 18, a power supply circuit 20, and a mode setting circuit 24.

In the present embodiment, the memory system 100 is connected to an external device via the connector terminals 18. The external device is a host of the memory system 100 or the like. The memory system 100 functions as an external storage device of the host. The host may be, for example, an information processing device such as a personal computer or a server, an imaging device, a mobile terminal such as a tablet computer or a smartphone, a game device, or an in-vehicle terminal such as a car navigation system.

The controller 10 includes a processor (not separately depicted). The controller 10 controls operations of the non-volatile memories 12 and 14 by executing a program or programs stored in the volatile memory 16 by the processor. The controller 10 is, for example, an integrated circuit configured as a system on a chip (SoC). The non-volatile memories 12 and 14 are, for example, NAND flash memories (may also be referred to as NAND memories). Although FIG. 1 shows two non-volatile memories 12 and 14, the number thereof is not limited to 2. The volatile memory 16 is, for example, a synchronous dynamic random-access memory (SDRAM), but is not limited thereto. In another instance, the volatile memory 16 may be arranged inside the controller 10.

When the memory system 100 starts up, the programs stored in the non-volatile memories 12 and 14 are written into the volatile memory 16. The programs are for the memory system 100 to operate. For example, the programs include a program for executing operations such as writing and reading data with respect to the non-volatile memories 12 and 14 such as NAND memories.

The controller 10 receives a command transmitted from the host, uses the volatile memory 16 as a cache as necessary, performs operations such as writing and reading with respect to the non-volatile memories 12 and 14, and transmits the data to the host.

The power supply circuit 20 is supplied with external power from a power supply circuit in the external device via the connector terminals 18. The power supply circuit 20 generates a plurality of internal power voltages from the supplied external power and supplies these internal power voltages to each circuit in the memory system 100. The power supply circuit 20 detects a rise of the power in response to the start of supply of the external power and generates a power-on reset (POR) signal in response to the detection. The power supply circuit 20 supplies the generated POR signal to the controller 10. The power supply circuit 20 includes a power source IC 21 (see FIG. 2) and peripheral circuits configured as a semiconductor integrated circuit or an electrical component. The power source IC 21 executes, for example, detection of rise of the power and generation of the POR signal.

The mode setting circuit 24 includes four pads in the present embodiment. Two of the four pads are connected to a ground (GND) wiring that becomes a GND potential in the memory system 100, and the other two are connected to the controller 10. One of the other two pads is connected to a recognition mark 32 (see FIG. 2, for example). The mode setting circuit 24 is used for switching operation modes of the controller 10. Example operation modes include, but not limited to, a normal operation mode, a debug operation mode for defect analysis, and the like. The mode setting circuit 24 can generate a 2-bit (that is, four-value) mode switching signal via the two pads connected to the controller 10. The mode switching signal provides instructions to switch the operations of the controller 10. The mode switching signal is transmitted to the controller 10 via the pads by, for example, a manufacturer of the memory system 100.

Figure 2:
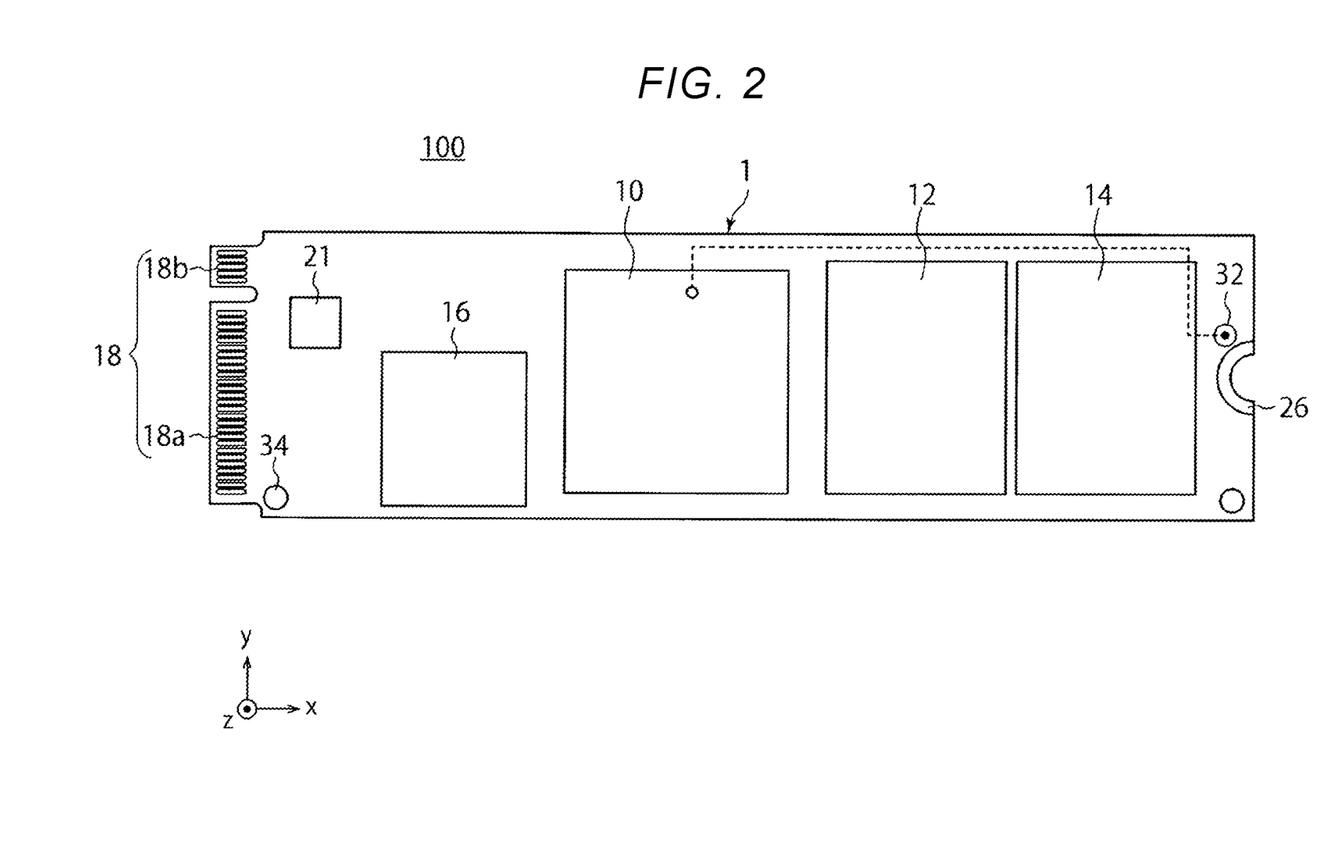
FIG. 2 depicts a schematic configuration of a memory system in a plan view according to an embodiment.

The schematic configuration of the memory system 100 of the present embodiment is shown in FIG. 2. FIG. 2 is a plan view seen from the z direction.

In the memory system 100, the controller 10, the non-volatile memories 12 and 14, the volatile memory 16, the connector terminals 18, and the power source IC 21 are mounted on a printed wiring board (herein may also be referred to as a wiring board) 1 on which the wiring pattern is formed. The connector terminals 18 includes two connector terminals 18a and 18b. Furthermore, on the printed wiring board 1, a ground (GND) terminal 26 (connected to the GND wiring (ground wiring)) and two recognition marks 32 and 34 are disposed. The recognition marks 32 and 34 may be referred to as first recognition mark 32 and second recognition mark 34, respectively. The GND terminal 26 is connected to the GND wiring and is gold-plated. The connector terminals 18 comprise a wiring pattern formed on a surface of the printed wiring board 1.

The printed wiring board 1 has a substantially rectangular planar shape which is longer in the x direction than in the y direction. The connector terminals 18 are disposed on one of the short sides (that is, one of the sides/edges that extend along the y direction) of the printed wiring board 1. The second recognition mark 34 is disposed near the connector terminals 18. The power source IC 21 is also mounted in the area near the same short side. On the other short side, the first recognition mark 32 and the semicircular gold-plated GND terminal 26 are disposed close to each other. The first recognition mark 32 and the second recognition mark 34 are disposed such that a straight line connecting the first and second recognition marks 32 and 34 extends at an angle that intersects the long sides (that is, the sides/edges that extend along the x direction) of the printed wiring board 1 instead of being parallel thereto.

The controller 10, the non-volatile memories 12 and 14, the volatile memory 16, and the power source IC 21 mounted on the printed wiring board 1 are electrically connected to each other by the wiring pattern(s) formed on the printed wiring board 1. The controller 10 has a plurality of external connection terminals (not separately depicted). One of the external connection terminals is electrically connected to a wiring in the recognition mark 32 via the wiring pattern. In this context, a configuration of two or more elements said to be electrically connected to each other includes a configuration where the two or more elements that are directly connected to each other or indirectly connected to each other via another conductor or conductive element such as a wiring, a wire, or the like.

The printed wiring board 1 has a multilayer structure formed by stacking a synthetic resin (for example, prepreg) and a copper foil. On the printed wiring board 1, wiring patterns are formed on a surface of each layer including the synthetic resin and the copper foil. In some instances, wiring connections may also include layer-to-layer connections penetrating through to the different layers of the printed wiring board 1. The wiring pattern can have a stacked structure including a copper foil and a copper plating formed on the copper foil. In this context, the prepreg is a wiring board base material obtained by impregnating a glass cloth with a resin (epoxy or the like) and then curing the resin to semi-cured state for forming another layer or the like. The prepreg is used for insulation between the stacked layers. The prepreg is cured by, for example, compression heating. A process of stacking the printed wiring board 1 or its layers includes the following example steps: a step of placing the prepreg and the copper foil on both surfaces of the base material of a base layer and curing the prepreg by compression heating; a step of making holes using a laser, a drill, or the like; a step of connecting parts at which the holes are located using copper plating; and a step of removing a copper plating and a copper foil pattern from unnecessary parts. The process of stacking the multiple layers of a printed wiring board 1 may include steps other than these.

Figure 3A:
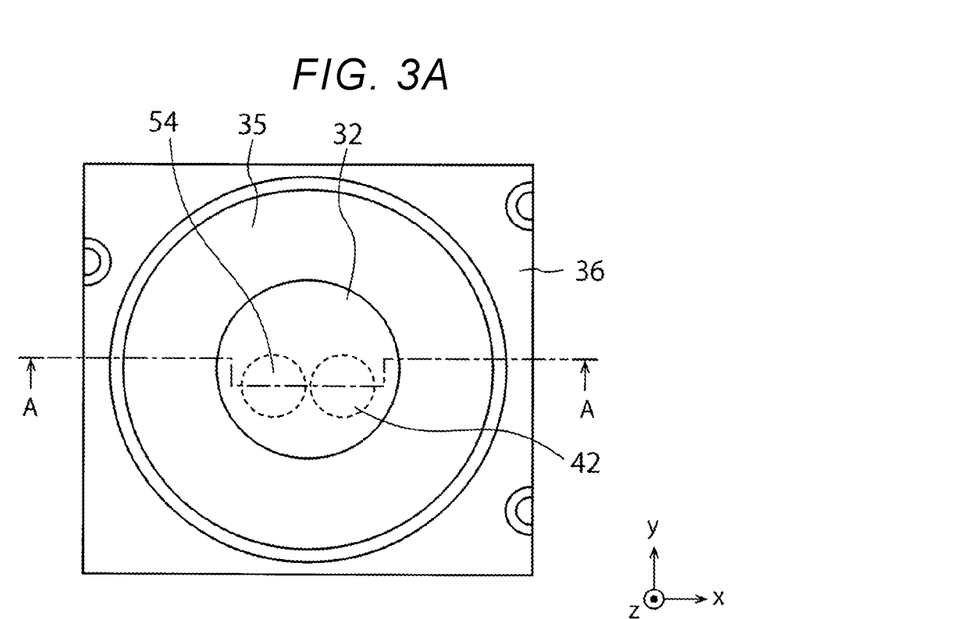
FIG. 3A depicts a recognition mark on a memory system in a plan view according to an embodiment.
Figure 3B:
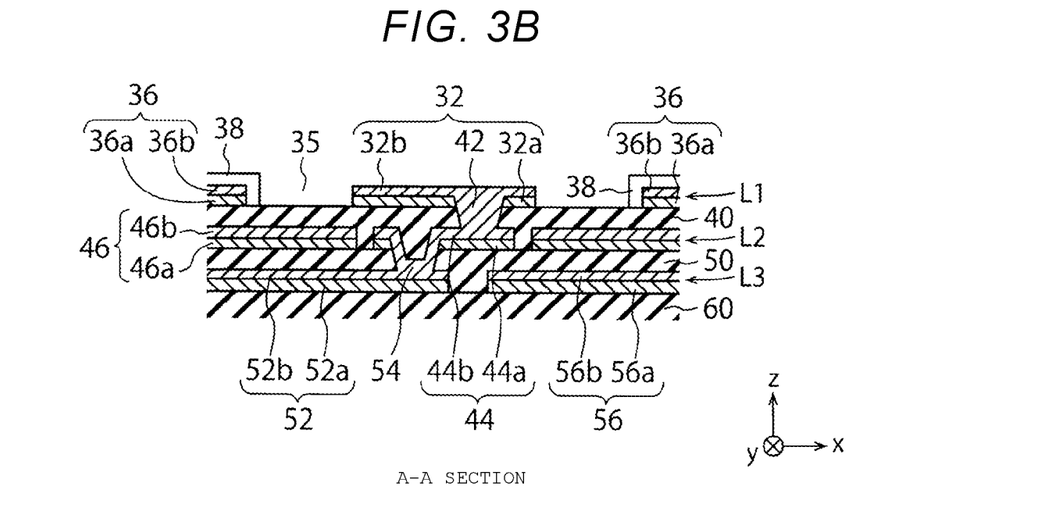
FIG. 3B depicts a recognition mark on a memory system in a cross-sectional view according to an embodiment.

FIG. 3A shows an enlarged view of the recognition mark 32 according to the present embodiment, and FIG. 3B shows a cross-section along the cutting line A-A shown in FIG. 3A. As shown in FIG. 3B, the printed wiring board 1 of the present embodiment includes at least a first wiring layer L1, a second wiring layer L2, and a third wiring layer L3.

The recognition mark 32 in this example includes a wiring part and an insulating portion, but in the following description, the recognition mark 32 is described for simplicity by reference to the wiring part thereof. The first wiring layer L1 has a first surface that intersects the z-axis. Electronic components (for example, the controller 10, the non-volatile memories 12 and 14, the volatile memory 16, the power supply circuit 20, and the like which are shown in FIG. 1) are mounted on the first surface of the first wiring layer L1. As shown in FIG. 3B, the recognition mark 32 is also provided on the first surface. The wiring that forms the recognition mark 32 is electrically insulated from a wiring (herein may also be referred to as a first wiring) 36, such as a GND wiring, otherwise disposed around the recognition mark 32 on the first wiring layer L1. The recognition mark 32 includes a first part 32a formed by a copper foil and a second part 32b formed by copper plating on the first part 32a. As shown in FIG. 3A, the recognition mark 32 has a circular planar shape having a diameter of, for example, 1.0 mm. As shown in FIG. 3B, the first wiring 36 includes a first part 36a formed by a copper foil and a second part 36b formed by copper plating on the first part 36a. Between the recognition mark 32 and the first wiring 36, an unwired region 35 is provided surrounding the recognition mark 32. The unwired region 35 does not include copper foil and copper plate therein and may be considered an insulating portion or an unconducive interstitial portion left between conductive portions. The unwired region 35 separates the recognition mark 32 and the first wiring 36 on the first wiring layer L1 and electrically insulates the recognition mark 32 from the first wiring 36. A solder resist 38 is formed on top and side surfaces of the first wiring 36, but not on the recognition mark 32 and the unwired region 35.

An insulating layer (or a first insulating layer) 40 formed by a synthetic resin (for example, prepreg), which is an insulator, is provided between the first wiring layer L1 and the second wiring layer L2. The insulator layer 40 electrically insulates the first wiring layer L1 from the second wiring layer L2. In the present example, the second wiring layer L2 is provided on the negative z-axis direction side of the first wiring layer L1. For simplicity of description, the second wiring layer L2 may be said to be below the first wiring layer L1 in the various figures. As shown in FIG. 3B, the second wiring layer L2 includes a pad 44 that is electrically connected to the recognition mark 32 of the first wiring layer L1 and other wiring 46, which may be a ground wiring or the like. The other wiring 46 may be referred to as a second wiring 46. The pad 44 includes a first part 44a formed by a copper foil and a second part 44b formed by copper plating on the first part 44a. Similarly, the second wiring 46 includes a first part 46a formed by a copper foil and a second part 46b formed by copper plating on the first part 46a. The second part 44b of the pad 44 can be electrically connected to the second part 32b of the recognition mark 32 through a via hole 42 formed, for example, by a laser processing then filled by copper plating or the like. The via hole 42 filled by the copper plating may be referred to as a via. The copper plating used for filling via hole 42 results in a surface of the second part 32b of the recognition mark 32 that is flat. A flat surface is convenient for use in image recognition when reading the position of the recognition mark 32 for mounting electronic components on the wiring pattern of the printed wired board 1. As shown in FIGS. 3A and 3B, the pad 44 provided on the second wiring layer L2 does not protrude outside the recognition mark 32 when viewed from the positive direction of the z-axis (that is when viewed from the first surface of the first wiring layer L1). The pad 44 is disposed in a region inside outer planar dimensions of the recognition mark 32.

An insulating layer 50, formed by a synthetic resin (for example, prepreg), is provided between the second wiring layer L2 and the third wiring layer L3. The insulating layer 50 electrically insulates the second wiring layer L2 from the third wiring layer L3. The third wiring layer L3 in this example is provided on the negative z-axis direction side of the second wiring layer L2. As shown in FIG. 3B, the third wiring layer L3 includes a wiring (herein may also be referred to as a third wiring) 52 connected to the controller 10 and another wiring 56. The wiring 56 may be, for example, a GND wiring. However, the wiring 56 may be connected to a power supply wiring having any power potential in the memory system 100. The third wiring 52 includes a first part 52a formed by a copper foil and a second part 52b formed by copper plating on the first part 52a. The second part 52b is electrically connected to the pad 44 of the second wiring layer L2 through a via hole 54, for example, by a laser processing. Similarly, the wiring 56 includes a first part 56a formed by a copper foil and a second part 56b formed by copper plating on the first part 56a. As shown in FIGS. 3A and 3B, the via hole 54 does not protrude outside the recognition mark 32 when viewed from the positive direction of the z-axis (that is when viewed from the first surface). The via hole 54 is disposed in a region inside outer planar dimensions of the recognition mark 32. The via hole 54 may be referred to as a via. A fourth wiring layer (or more) can be provided below the third wiring layer L3. The third wiring layer L3 and the fourth wiring layer would be electrically insulated from each other by an insulating layer formed by a synthetic resin (for example, prepreg). Another multilayer structure in which a wiring layer and an insulating layer are alternately arranged via another insulating layer may further be formed on such a fourth wiring layer.

Figure 4:
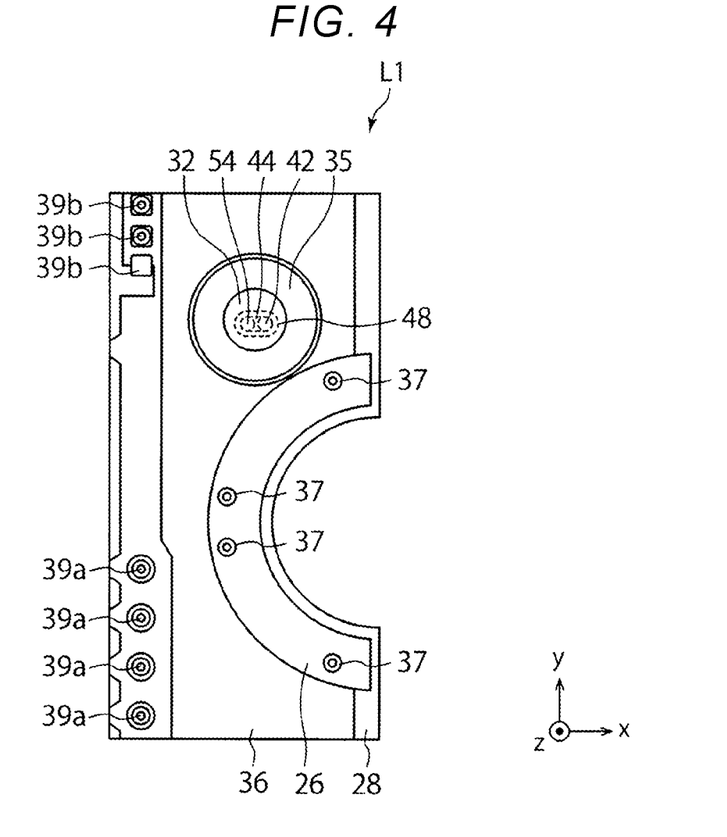
FIG. 4 depicts a part of a first wiring layer of a printed wiring board in a memory system in a plan view according to an embodiment.

FIG. 4 shows a plan view of the region including the recognition mark 32 on the first wiring layer L1 when viewed from the first surface (that is when viewed from the positive direction of the z-axis). As shown in FIG. 4, the first wiring 36 including the copper-plated second part 36b (see FIG. 3B) is provided around the recognition mark 32 with the unwired region 35 existing therebetween. The first wiring 36 is formed as a part of the same pattern as the GND terminal 26 and is covered with a solder resist. The GND terminal 26 can be formed as a part of the same pattern as the first wiring 36 but is not covered with a solder resist. The GND terminal 26 can be gold-plated on top of the copper plating to prevent oxidation. The copper plating of the GND terminal 26 is provided with, for example, four pads 37 to be connected to the second wiring layer L2.

In regions other than the region where the first wiring 36 is provided, a plurality of pads 39a (for example, four pads in the present embodiment) that can be connected to the non-volatile memories 12 and 14 and a plurality of pads 39b (for example, four pads in the present embodiment) on which electronic components can be mounted are provided. An unwired portion 28 in which a wiring pattern is not formed is provided at the other end portion on the short side of the first wiring layer L1. Since the first wiring layer L1 has the recognition mark 32, the via holes 42 and 54 cannot be recognized when viewed from the first surface (that is when viewed from the positive direction of the z-axis).

Figure 5:
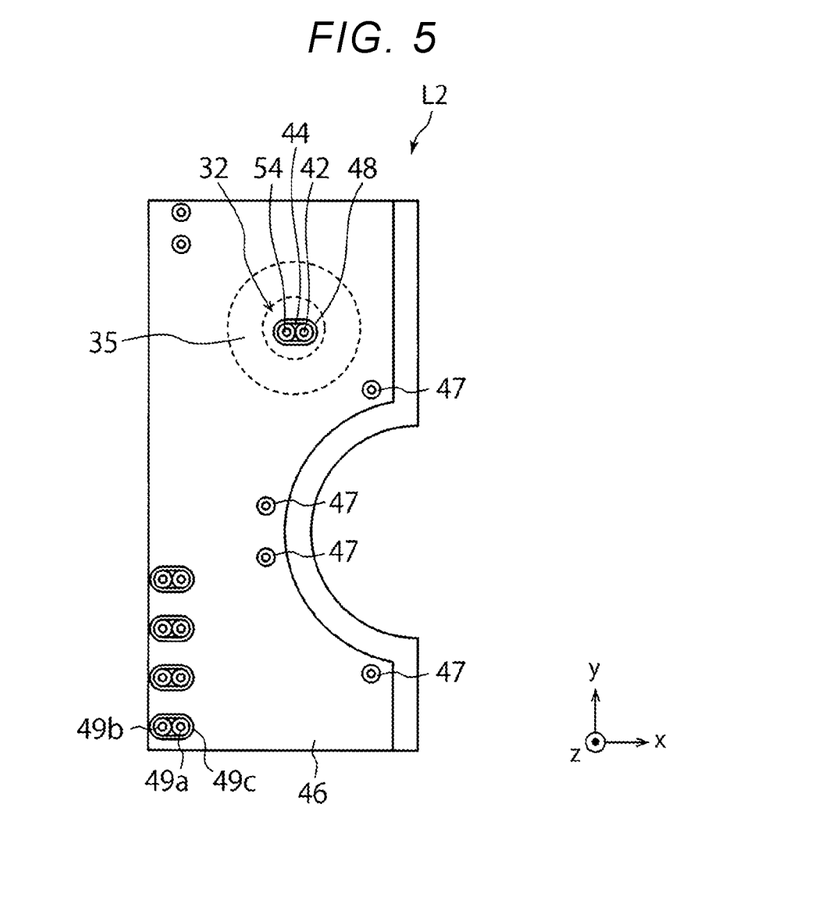
FIG. 5 depicts a part of a second wiring layer of a printed wiring board in a memory system according to an embodiment.

FIG. 5 shows a plan view of the second wiring layer L2 when viewed from the positive direction of the z-axis. As shown in FIG. 5, the via holes 42 and 54 and the pads 44 are below the recognition mark 32 when viewed from the positive direction of the z-axis. The pad 44 connects the via hole 42 and the via hole 54 to each other. These via holes 42 and 54 are disposed in, for example, an elliptical region 48 in which the second wiring 46 is not formed. The region 48 is on the negative z-axis direction side of the recognition mark 32. The region 48, as viewed from the positive direction of the z-axis, does not protrude outside the recognition mark 32 but rather is contained in a region inside outer planar dimensions of the recognition mark 32. On the negative z-axis direction side of the unwired region 35 in the second wiring layer L2, which surrounds the recognition mark 32 on the first wiring layer L1 and where the first wiring 36 is not formed, the region 48 is covered with the second wiring 46 (see FIGS. 3A and 3B). Furthermore, on the second wiring layer L2, a pad 49a is provided. The pad 49a is electrically connected to the pad 39a on the first wiring layer L1 by, for example, a through hole connection or the like. Another pad 49b is disposed adjacent to the pad 49a. These pads 49a and 49b are, when viewed from the positive direction of the z-axis, disposed in, for example, an elliptically shaped region 49c. The second wiring 46 is not formed inside the region 49c. The second wiring 46 of the second wiring layer L2 is provided with a plurality of pads 47 (four in the present example) that are electrically connected, respectively, to each of to the four pads 37 of the first wiring layer L1.

Figure 6:
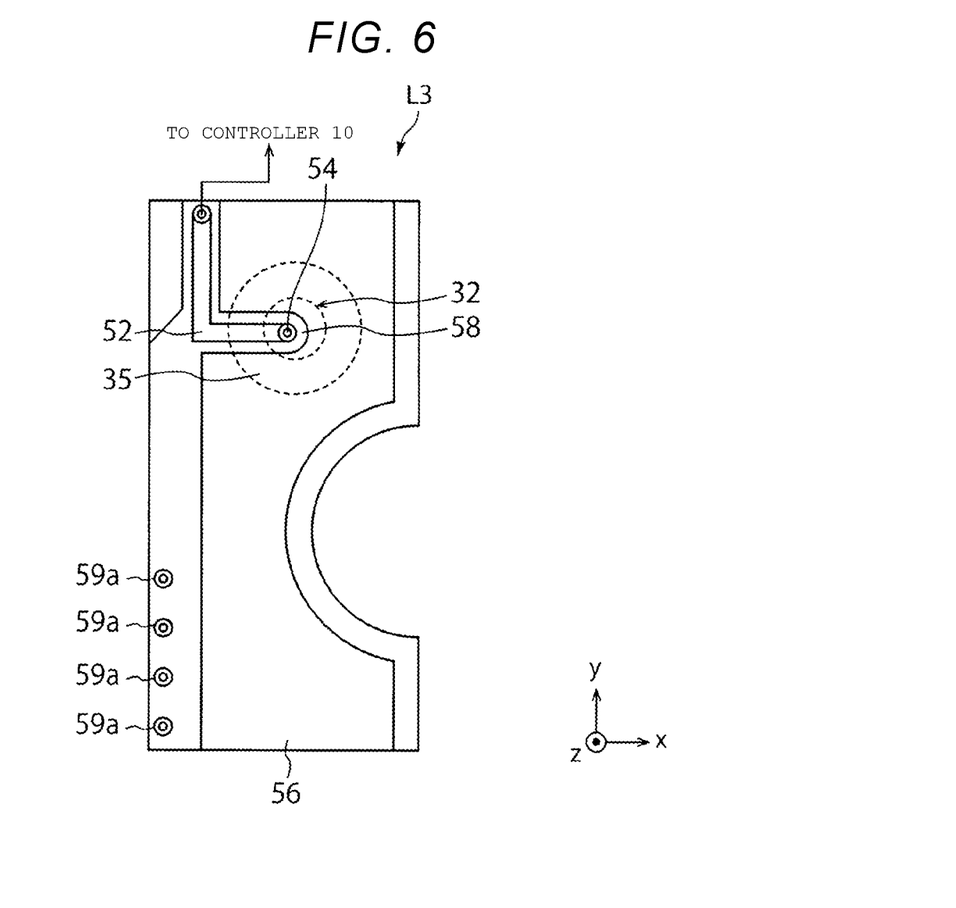
FIG. 6 depicts a part of a third wiring layer of a printed wiring board in a memory system according to an embodiment.

FIG. 6 shows a plan view of the third wiring layer L3 when viewed from the positive direction of the z-axis. As shown in FIG. 6, the third wiring 52 that is electrically connected to the via hole 54 and is electrically connected to the controller 10 via the mode setting circuit 24 (see FIG. 1) is provided. The third wiring 52 is disposed in a region 58 where wiring 56 is not provided. A part of the third wiring 52 is to the negative z-axis direction side of the unwired region 35 of the first wiring layer L1. The second wiring 46 (see FIG. 3B) of the second wiring layer L2 is provided in the positive direction of the z-axis of a part of the third wiring 52. The third wiring layer L3 is provided with, for example, four pads 59a that are electrically connected to the non-volatile memories 12 and 14. These pads 59a are electrically connected to the pads 39a provided on the first wiring layer L1 via the two pads 49a and 49b (see FIG. 5) provided in the second wiring layer L2. The third wiring 52 of the third wiring layer L3 is not transparently visible at all in a plan view from the first surface of the first wiring layer L1 due to the recognition mark 32 of the first wiring layer L1 and the second wiring 46 of the second wiring layer L2.

In the present embodiment, the recognition mark 32 is electrically connected to the third wiring 52 that is connected to the controller 10 via the mode setting circuit 24. The third wiring 52 is electrically connected to the recognition mark 32 by a connection of the via hole 54, the pad 44, and the via hole 42 which are provided in different wiring layers of the printed wiring board 1. With this configuration, it is possible to cause the mode setting circuit 24 to generate a mode switching signal for the operation of the controller 10 via the recognition mark 32 and the third wiring 52. For example, when the power of the memory system 100 is turned on, the mode setting circuit 24 can generate an "L" level mode switching signal by connecting the third wiring 52 to a GND wiring using the recognition mark 32 and the GND terminal 26. In this manner, the operation mode of the controller 10 can be switched for testing the memory system 100 or the like by using a connection through the recognition mark 32 and the GND terminal 26.

The via hole 42, the pad 44, and the via hole 54 that are electrically connected to the recognition mark 32 are provided in a region within the outer perimeter of the recognition mark 32 as viewed from the first surface of the first wiring layer L1. These via holes 42 and 54 and the pad 44 do not extend into the unwired region 35 provided outside of the outer perimeter of the of the recognition mark 32. The third wiring 52 electrically connected to both the recognition mark 32 and the controller 10 is provided on the third wiring layer L3. The third wiring 52 is covered (overlapped) by the first and second insulating layers 40 and 50 and the second wiring 46 of the second wiring layer L2 when viewed from the first surface side of the first wiring layer L1. Therefore, the recognition mark 32 can provide the same image recognition accuracy for the position reading of the recognition mark 32 as for a case of not being electrically connected to the third wiring 52.

According to the present embodiment, a mode switching signal of the operation of the controller 10 is not input to the second recognition mark 34. However, by using substantially the same configuration as the first recognition mark 32, the second recognition mark 34 may be connected to a mode setting circuit 24 so that a mode switching signal can be provided via the second recognition mark 34. In such a case, a 1-bit mode switching signal can be set for each of the first and second recognition marks 32 and 34, and a total of 4 bits can be generated for the mode switching signal.

According to the present embodiment, it is possible to provide a printed wiring board and a memory system having the printed wiring board, capable of effectively using a space otherwise occupied by a single-purpose recognition mark lacking any purpose after completion of product fabrication processes.

While certain embodiments have been described, these embodiments have been presented by way of example only and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A printed wiring board, comprising:
   a first wiring layer comprising a first recognition mark and a first wiring on a first surface thereof, the first wiring surrounding the first recognition mark;
   a second wiring layer comprising a first pad and a second wiring, a portion of the second wiring being in a region between the first wiring and the first recognition mark when viewed from a direction orthogonal to the first surface;
   a third wiring layer comprising a third wiring;
   a first insulating member between the first wiring layer and the second wiring layer;
   a second insulating member between the second wiring layer and the third wiring layer;
   a first via that penetrates the first insulating member and electrically connects the first recognition mark to the first pad; and
   a second via that penetrates the second insulating member and electrically connects the first pad to the third wiring, wherein
   the first pad and the first and second vias are in a region within an outer perimeter of the first recognition mark when viewed from the direction orthogonal to the first surface.

2. The printed wiring board according to claim 1, wherein the second wiring surrounds the first pad.

3. The printed wiring board according to claim 1, wherein the third wiring layer further comprises a fourth wiring, and
   the fourth wiring surrounds the second via and a part of the third wiring.

4. The printed wiring board according to claim 1, wherein the first wiring layer comprises:
   a ground wiring connected to a wiring to be a ground potential, a part of the ground wiring forming the first wiring; and
   a ground terminal that is part of the ground wiring and gold-plated.

5. The printed wiring board according to claim 1, wherein the first recognition mark, the first pad, the first wiring, the second wiring, and the third wiring each includes a copper foil portion and a copper-plated portion on the copper foil portion.

6. The printed wiring board according to claim 1, wherein the first via is filled by plating of copper.

7. The printed wiring board according to claim 1, further comprising:
   a second recognition mark on the first surface.

8. The printed wiring board according to claim 1, wherein electronic components are mounted on the first surface.

9. The printed wiring board according to claim 1, wherein the first and second insulating members are insulating layers.

10. The printed wiring board according to claim 9, wherein
the first recognition mark comprises a first part formed by a copper foil and a second part formed by copper plating on the first part, and
the second part is on an upper surface of the first recognition mark.

11. The printed wiring board according to claim 10, wherein the second part is electrically connected to the first pad by the first via.

12. The printed wiring board according to claim 1, wherein the third wiring is electrically connected to the first recognition mark and is covered by the first and second insulating members and the second wiring when viewed from the first surface.

13. A printed wiring board, comprising:
a first wiring layer comprising a recognition mark and a first wiring on a first surface thereof, the first wiring being insulated from the recognition mark;
a second wiring layer below the first wiring layer in a first direction orthogonal to the first surface and comprising a first pad and a second wiring, the second wiring being in a region between the recognition mark and the first wiring when viewed from the first direction;
a third wiring layer comprising a third wiring;
a first insulating member between the first wiring layer and the second wiring layer in the first direction;
a second insulating member between the second wiring layer and the third wiring layer in the first direction;
a first via that penetrates the first insulating member and electrically connects the recognition mark to the first pad; and
a second via that penetrates the second insulating member and electrically connects the first pad to the third wiring, wherein
the first pad and the first and second vias are, when viewed from the first direction, in a region inside an outer perimeter of the recognition mark, and
the recognition mark comprises a first part formed by a copper foil and a second part formed by copper plating on the first part, the second part being at an upper surface of the recognition mark.

14. The printed wiring board according to claim 13, wherein the second part is electrically connected to the first pad by the first via.

15. The printed wiring board according to claim 13, wherein the third wiring is electrically connected to the recognition mark, and, when viewed from the first surface, is covered with the first and second insulating members and the second wiring.

16. A memory system, comprising:
a printed wiring board including:
a first wiring layer comprising a recognition mark and a first wiring on a first surface thereof, the first wiring surrounding the recognition mark;
a second wiring layer comprising a first pad and a second wiring, a portion of the second wiring being in a region between the recognition mark and the first wiring in a second direction parallel to the first surface when viewed from a first direction orthogonal to the first surface;
a third wiring layer comprising a third wiring;
a first insulating member between the first wiring layer and the second wiring layer in the first direction;
a second insulating member between the second wiring layer and the third wiring layer in the first direction;
a first via that penetrates the first insulating member and electrically connects the recognition mark to the first pad; and
a second via that penetrates the second insulating member and electrically connects the first pad to the third wiring;
a connector terminal on the printed wiring board for connection to an external device;
a non-volatile memory and a volatile memory mounted on the first surface of the printed wiring board;
a controller on the first surface of the printed wiring board, the controller being configured to control the non-volatile memory and the volatile memory, the third wiring being electrically connected to the controller;
a power supply circuit configured to generate, using an external power supplied thereto via the connector terminal, an internal power voltage to be supplied to the non-volatile memory, the volatile memory, and the controller; and
a setting circuit electrically connected to the recognition mark and the controller, the setting circuit being configured to generate a switching signal for setting an operation mode of the controller, wherein
the first pad and the first and second vias are in a region within an outer perimeter of the recognition mark when viewed from the first direction.

17. The memory system according to claim 16, wherein the power supply circuit is further configured to:
detect a rise of the external power;
generate a power-on reset signal; and
supply the power-on reset signal to the controller.

18. The memory system according to claim 16, wherein the setting circuit is configured to receive a 2-bit operation mode switching signal.

19. The memory system according to claim 16, wherein the setting circuit is configured to generate the switching signal by connecting the third wiring to a ground wiring via the recognition mark.

20. The memory system according to claim 16, wherein
the recognition mark comprises a first part formed by a copper foil and a second part formed by copper plating on the first part, the second part having a part at an upper surface of the recognition mark, and
the third wiring is electrically connected to the recognition mark and covered with the first and second insulating members and the second wiring when viewed from the first surface.

* * * * *